(12) United States Patent
Saito et al.

(10) Patent No.: US 7,183,012 B2
(45) Date of Patent: Feb. 27, 2007

(54) STRUCTURE HAVING PORES, MAGNETIC RECORDING MEDIUM, AND METHOD OF MANUFACTURING SAME

(75) Inventors: Tatsuya Saito, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 31 days.

(21) Appl. No.: 10/389,935

(22) Filed: Mar. 18, 2003

(65) Prior Publication Data

US 2003/0186084 A1 Oct. 2, 2003

(30) Foreign Application Priority Data

Mar. 27, 2002 (JP) .............................. 2002-088941

(51) Int. Cl.
*G11B 5/708* (2006.01)
*G11B 5/71* (2006.01)
*B05D 5/12* (2006.01)

(52) U.S. Cl. ............................... 428/831.2; 428/846.2; 428/848.5; 427/129

(58) Field of Classification Search ............ 428/320.2, 428/611, 687, 65.3, 65.6, 323, 329, 332, 375, 428/550, 577, 103, 117, 341, 692, 693, 694 T, 428/694 TR, 694 R, 694 TS, 900, 846, 846.2, 428/846.4, 847.7, 848.3, 692.1, 693.1, 928; 257/421, 422, 425, 741; 248/455; 210/155, 210/407, 488; 29/603.1, 603.7, 623.1, 623.5; 205/118, 122; 429/34; 360/133, 135, 136, 360/99.12, 98.08; 365/199; 204/192.1, 204/192; 427/271; 369/281
See application file for complete search history.

(56) References Cited

U.S. PATENT DOCUMENTS

| 5,108,812 A | * | 4/1992 | Takahashi et al. ........ 204/192.1 |
| 5,160,616 A | * | 11/1992 | Blake-Coleman ........... 210/407 |
| 5,470,636 A | * | 11/1995 | Wakui et al. ............. 428/694 T |
| 5,589,285 A | * | 12/1996 | Cable et al. ................... 429/34 |
| 5,923,511 A | * | 7/1999 | Bandara et al. .............. 360/135 |

(Continued)

FOREIGN PATENT DOCUMENTS

| JP | 10-121292 | 5/1998 |
| JP | 00/277330 | 10/2000 |

OTHER PUBLICATIONS

Translation of JA 11-086118.*

(Continued)

*Primary Examiner*—Carol Chaney
*Assistant Examiner*—Louis de Falasco
(74) *Attorney, Agent, or Firm*—Fitzpatrick, Cella, Harper & Scinto

(57) ABSTRACT

The invention provides a magnetic recording medium and a method of manufacturing the magnetic recording medium, in which a high density and good storage stability can be achieved by giving anisotropy in shape to a magnetic substance. A plan shape of the magnetic substance in the magnetic recording medium, which appears on the recording surface side, is an ellipse that is present within a rectangle and has a minor axis with a length equal to a short side of the rectangle. A quadrilateral defined by four intersects of two adjacent vertical rows and two adjacent horizontal rows, each of these rows comprising a plurality of pores, has a rectangular or rhombic shape.

5 Claims, 7 Drawing Sheets

U.S. PATENT DOCUMENTS

| | | | |
|---|---|---|---|
| 5,965,295 A * | 10/1999 | Bando et al. | 29/623.1 |
| 6,139,713 A | 10/2000 | Masuda et al. | 205/206 |
| 6,183,890 B1 * | 2/2001 | Fujita | 428/694 TS |
| 6,241,881 B1 * | 6/2001 | Pezzaniti | 210/155 |
| 6,464,853 B1 * | 10/2002 | Iwasaki et al. | 205/118 |
| 6,472,814 B1 * | 10/2002 | Yamanobe et al. | 313/311 |
| 6,602,620 B1 * | 8/2003 | Kikitsu et al. | 428/694 TS |
| 6,611,034 B2 * | 8/2003 | Den | 257/421 |
| 6,673,474 B2 * | 1/2004 | Yamamoto | 428/694 ST |
| 6,858,319 B2 * | 2/2005 | Yasui et al. | 428/846.4 |
| 6,930,057 B2 * | 8/2005 | Saito et al. | 427/271 |
| 2002/0153828 A1 * | 10/2002 | Yamanobe et al. | 313/309 |
| 2003/0223280 A1 * | 12/2003 | Okumura et al. | 365/199 |

OTHER PUBLICATIONS

R. C. Furneaux et al., "The Formation of Controlled-Porosity Membranes from Anodically Oxidized Aluminium", *Nature*, vol. 337, No. 6203, Jan. 12, 1989, pp. 147-149.

Hideki Masuda et al., "Fabrication of Gold Nanodot Array Using Anodic Porous Alumina as an Evaporation Mask", *Jpn. J. Appl. Phys.*, vol. 35, 1996, Pt. 2, No. 1B, pp. 126-129.

M. Wesolowski, "Fractal-like model of porous silicon", Physical Review, B 66, 205207-1 to -5 (2002).

* cited by examiner 11  12  13

DIRECTION OF APPLIED MAGNETIC FIELD

DIRECTION OF APPLIED MAGNETIC FIELD

STRUCTURE HAVING PORES, MAGNETIC RECORDING MEDIUM, AND METHOD OF MANUFACTURING SAME

BACKGROUND OF THE INVENTION

1. Field of the Invention

The present invention relates to a structure having pores, a magnetic recording medium, and a method of manufacturing the magnetic recording medium.

2. Description of the Related Art

Magnetic recording media represented by hard disks have been drastically progressed in recent years, and the recording density has increased at a rate as high as 100% per year. Though at a laboratory level, the recording density up to 50 Gb/in$^2$ is achieved at present. Intensive studies and developments are continued with an expectation of a further improvement in recording density.

Presently, magnetic recording on a hard disk is performed by a longitudinal recording method, also called an in-plane recording method, in which magnetization is recorded in the horizontal direction with respect to a substrate. In the in-plane recording method, bit information is recorded and reproduced with a magnetic head by utilizing a leaked magnetic field from a magnetization transit region provided between adjacent magnetized recording areas. Each of the magnetized recording areas provided on a track has a nearly rectangular shape with a size of 300 μm (bit width) corresponding to the track width and 30 nm (bit length) corresponding to the direction of length of the track. The magnetization is oriented in the direction of length of the track. With the conventional in-plane recording method, as the bit length is reduced to improve the recording density, the leaked magnetic field from the magnetization transit area is also reduced. This results in a problem that the leaked magnetic field can no longer be detected if the bit length becomes too small. The problem can be avoided by reducing the film thickness of a magnetic layer. However, this solution raises another problem that an extreme reduction of the bit volume causes a super-paramagnetic state in which the direction of magnetization is changed with the effect of thermal energy, and hence the recorded magnetization cannot be properly retained. Taking into account those problems, it is thought that an upper limit of the recording density obtainable with the in-plane recording method is approximately 100 Gb/in$^2$. On the other hand, in the recording density range beyond 100 Gb/in$^2$, a vertical recording method is more potentially expected in which a magnetic substance having magnetic anisotropy in the vertical direction with respect to a substrate is employed as a recording layer and magnetization is recorded in the vertical direction with respect to the substrate.

In contrast with the in-plane recording method, the vertical recording method has a property that a demagnetizing field is reduced at a higher density. Also, because a sufficient film thickness of the magnetic layer can be maintained even with an increase of the recording density, the vertical recording method is superior to the in-plane recording method in resistance against the super-paramagnetic state caused with the effect of thermal energy. For those reasons, it is thought that the vertical recording method is more highly potential than the in-plane recording method in the recording density range beyond 100 Gb/in$^2$. In the vertical recording method, a Co—Cr alloy is generally used as a recording layer. When the Co—Cr alloy is formed on a substrate made of, e.g., Si, glass or carbon by sputtering, Co and Cr grow in a state in which the two components are separated. More specifically, a portion containing a larger amount of Co component has a columnar shape and provides a ferromagnetic area having a hexagonal close-packed (hcp) structure, which serves as a recording area. A portion containing a larger amount of Cr component, which grows in a surrounding relation to the columnar recording area, is a nonmagnetic area and serves to weaken the magnetic interaction between the adjacent recording areas.

Further, a magnetic recording medium has also been proposed in which a structure including a magnetic material buried in a nonmagnetic material to serve as a columnar recording area, as described above, is artificially formed in a regular pattern by the lithography. One example of such a magnetic recording medium is manufactured by the steps of forming pores regularly arrayed on a substrate through a series of processes of coating a resist on a vitreous carbon substrate, patterning the resist with electron beam drawing, and etching the patterned resist, then filling a magnetic material NiFe in the pores by sputtering, and polishing the substrate surface such that the magnetic material and the nonmagnetic material have flat surfaces (see Japanese Patent Laid-Open No. 2000-277330).

In a magnetic recording medium of the type called patterned media, which is featured in recording one bit in each of the above-mentioned pores filled with the magnetic substances, unlike magnetic recording media utilizing the in-plane recording method and the vertical recording method, a structure more suitable for higher density recording is obtained because a recording area is made up of the pores filled with minute magnetic substances, and the magnetic substances are arrayed in the same shape and the same size. Such a magnetic recording medium has received big attention as a medium expectable in the next generation because it can realize the recording density of 1 Tb/in$^2$ by further reducing the pore size and the pore pitch.

On the other hand, among general pore forming methods, a method of forming pores with anodic oxidation of Al is known as one capable of forming a large number of minute pores with a less variation in shape. With that known method, an anodic oxide film is formed as a porous anodic oxidation coating through anodic oxidation of an Al substrate performed in an acidic electrolyte, such as sulfuric acid, oxalic acid or phosphoric acid (see, e.g., R. C. Furneaux, W. R. Rigby & A. P. Davidoson & NATURE, Vol. 337, p 147 (1989)). The porous coating has a peculiar geometric structure featured in that very minute columnar pores (almina nanoholes) each having a diameter of several nanometers to several hundreds nanometers are arrayed in parallel at intervals of several tens nanometers to several hundreds nanometers. Those columnar pores have a high aspect ratio and also have high uniformity in diameters of their sections. Here, when the pore is quadrilateral, e.g., rectangular, in section, the aspect ratio is represented by y/x where x is the length of a longer side (length of one side in the case of a square shape) and y is the pore depth. When the pore is circular in section, the aspect ratio is represented by y/x where x is the pore diameter and y is the pore depth.

Also, the structure of the porous coating can be controlled to some extent by changing the conditions of anodic oxidation. For example, it is known that the pore pitch, the pore depth and the pore diameter can be controlled to some extent respectively depending on the anodic oxidation voltage, the anodic oxidation time, and the pore widening process. Here, the pore widening process means an alumina etching process, which is usually carried out as a wet etching process using phosphoric acid.

Further, to improve verticality, straightness and independence of pores in the porous coating, there is proposed a method of carrying out the anodic oxidation in two stages, i.e., a method of carrying out the anodic oxidation to form a porous coating, removing the porous coating, and then carrying out the anodic oxidation again to form a porous coating with pores having higher verticality, straightness and independence (see Japanese Journal of Applied Physics, Vol. 35, Part 2, No. 1B, pp. L126–L129, Jan. 15, 1996). This proposed method is based on that dents of the Al substrate, which are obtained after removing the anodic oxidation coating formed by the first anodic oxidation, serve as start points for pore formation in the second anodic oxidation.

In addition, to improve controllability of the shape, pitch and pattern of pores in the porous coating, there is proposed a method of forming start points for formation of the pores using a stamper, i.e., a method of depressing a board having a plurality of bosses on its surface against the surface of an Al substrate, thereby forming dents as start points for pore formation, and then carrying out the anodic oxidation to form a porous coating with pores exhibiting better controllability of the shape, pitch and pattern of the pores (see Japanese Patent Laid-Open No. 10-121292 (Nakao) and Masuda, *Kotai Butsuri* (Solid State Physics), 31, 493 (1996)). Also, there are known a method of forming dents as start points for pore formation by irradiating an FIB (focused ion beam) onto a substrate surface, and a method of forming dents as start points for formation of patterned pores by uniformly coating a resist resin on substrate surface, patterning the resist by the photolithography or the electron beam lithography, and then dry etching the substrate surface.

Applying alumina nanoholes to patterned media by filling magnetic substances in the alumina nanoholes formed by the anodic oxidation is a technique already known. In the case of employing the alumina nanoholes, it is also possible to obtain a medium of the in-plane recording type if the magnetizing direction of the magnetic substance filled in each of the alumina nanoholes can be controlled in the in-plane directions, and to obtain a medium of the vertical recording type if the control can be performed in the vertical direction. However, the alumina nanoholes are usually in the columnar form and the columnar pore structure is more suitable for a medium of the vertical recording type from the viewpoint of physical structure. When the alumina nanoholes are applied to a medium of the in-plane recording type, the following drawbacks may occur.

In the columnar nanoholes, an energy difference due to anisotropy in shape of the nanoholes in the in-plane directions is not caused because of a circular section. This leads to a possibility that magnetization may rotate in the plane, or a possibility that the direction of magnetization is not uniform for all of the nanoholes. If the direction of magnetization is not uniform, the relative positional relationship between magnetization of the magnetic substances filled in the nanoholes and a magnetic head for detecting the magnetization is changed for each nanohole. Consequently, precise recording and reproduction on and from the magnetic recording medium cannot be achieved.

SUMMARY OF THE INVENTION

With the view of overcoming the problems set forth above, it is an object of the present invention to provide a magnetic recording medium and a method of manufacturing the recording medium, in which the direction of magnetization of magnetic substances arrayed using nanoholes can be suitably controlled not only in a direction crossing a recording surface, but also in a direction along the recording surface.

Another object of the present invention is to provide a structure having pores in which functional materials, such as magnetic substances, can be filled.

To achieve the above object, the present invention provides a magnetic recording medium including magnetic substances filled in pores extending in a direction crossing a recording surface, wherein a plan shape of each of the magnetic substances appearing on the recording surface side is expressed by a closed curve that is present within a rectangle and includes an ellipse having a minor axis with a length equal to a short side of the rectangle.

Also, the present invention provides a method of manufacturing a magnetic recording medium including magnetic substances filled in pores extending in a direction crossing a recording surface, in which a plan shape of each of the magnetic substances appearing on the recording surface side is expressed by a closed curve that is present within a rectangle and includes an ellipse having a minor axis with a length equal to a short side of the rectangle, the method comprising the steps of forming dents, serving as start points for pore formation, on a surface of a layer on a substrate, which is to be subjected to anodic oxidation and is capable of forming pores therein by the anodic oxidation; carrying out the anodic oxidation of the layer to be subjected to anodic oxidation with the dents serving as the start points for pore formation, thereby forming the pores in the layer having been subjected to anodic oxidation; and filling magnetic substances in the pores.

Thus, the magnetic substances are each given with an elliptic shape so as to develop anisotropy in shape, and magnetizing directions of the magnetic substances filled in the pores (nanoholes) are fixed in a direction in which higher stability is achieved from the viewpoint of energy. Hence a magnetic recording medium can be obtained in which the relative positional relationship between magnetization of the magnetic substances filled in the nanoholes and a magnetic head for detecting the magnetization can be always held constant.

Further, a structure in which elliptic pores are formed can be applied to a filter, a sensor, and so on.

Further objects, features and advantages of the present invention will become apparent from the following description of the preferred embodiments with reference to the attached drawings.

DESCRIPTION OF THE PREFERRED EMBODIMENTS

Preferred embodiments of the present invention will be described with reference to the drawings.

The present invention is concerned with a structure having pores extending in a direction crossing a substrate surface, wherein a plan shape of each of the pores appearing on the substrate surface is expressed by a closed curve that is present within a rectangle and includes an ellipse having a minor axis with a length equal to a short side of the rectangle.

(Method of Manufacturing Magnetic Recording Medium)

The present invention is concerned with a magnetic recording medium employing the above structure, and a method of manufacturing the magnetic recording medium, the method comprising the steps of forming, on a substrate, dents serving as start points for formation of pores (nanoholes), forming alumina nanoholes by anodic oxidation, and filling magnetic substance in the alumina nanoholes formed by the anodic oxidation.

Also, the magnetic recording medium of the present invention is a patterned medium in which magnetic substances are filled in pores in the form of alumina nanoholes obtained by anodic oxidation, and one bit is recorded in each pore or in a plurality of pores.

In alumina nanoholes formed through self-organization, the nanohole diameter can be controlled over the range of several nanometers to several hundreds nanometers, and the nanohole pitch can also be controlled over the range of a value slightly larger than the nanohole diameter to about 500 nm. A film layer to be subjected to anodic oxidation preferably contains Al as a main component. Various acids are usable for anodic oxidation of Al. A sulfuric acid bath is preferable for forming nanoholes at a relatively small pitch, a phosphoric acid bath is preferable for forming nanoholes at a relatively large pitch, and an oxalic acid is preferable for forming nanoholes at an intermediate pitch. Also, the nanohole diameter can be enlarged with an etching step carried out in a solution of sulfuric acid, for example, after the anodic oxidation.

Figure 1:
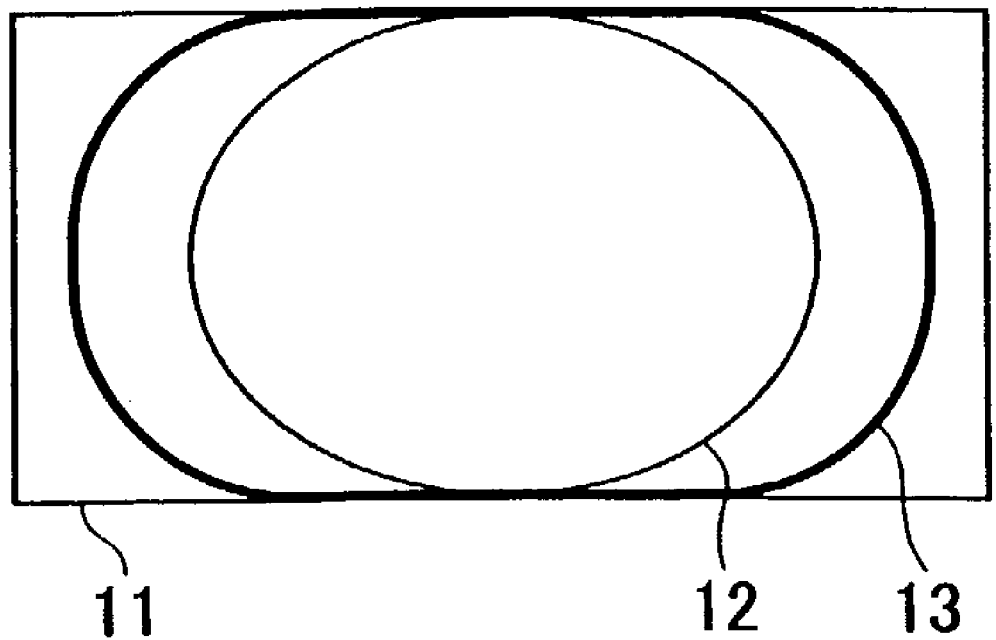
FIG. 1 is a schematic view showing a nanohole filled with an elliptic magnetic substance.
Figure 2:
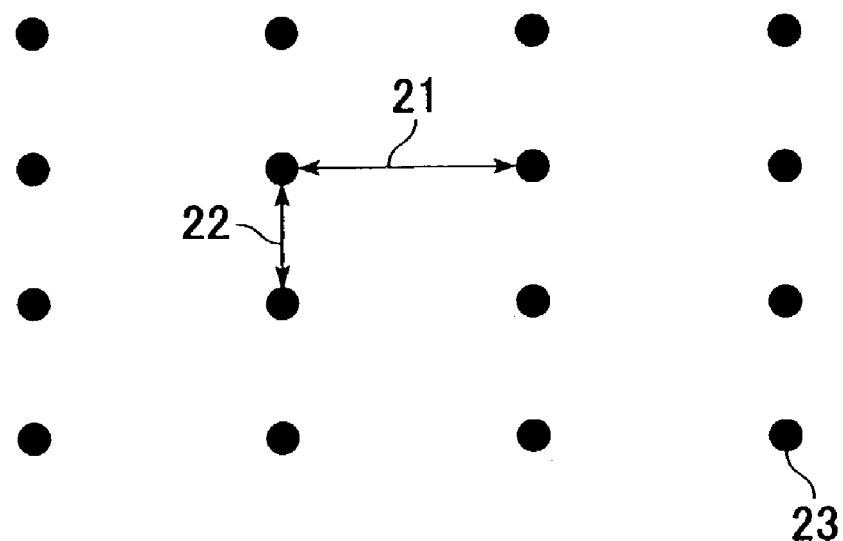
FIG. 2 is a schematic view showing a rectangular array of dents.
Figure 3:
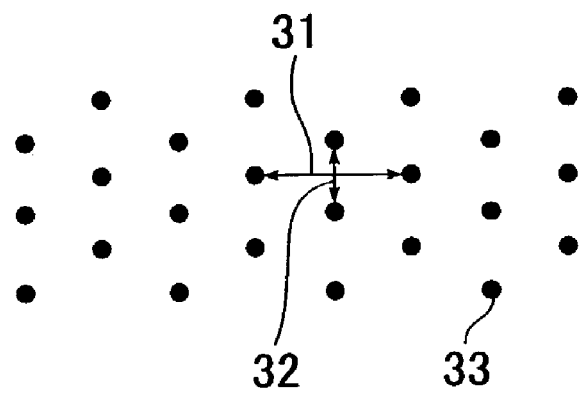
FIG. 3 is a schematic view showing a rhombic array of dents.

FIG. 1 shows a nanohole 13 according to the present invention, which is present in a rectangle 11 and includes an ellipse 12 having a minor axis with a length equal to a short side of the rectangle 11. To form the nanoholes 13, as shown in FIG. 2 or 3, dents serving as start points for formation of the nanoholes must be formed in a rectangular or rhombic array on a substrate on which a film made of Al or containing Al as a main component has been formed. The dents may be formed using a stamper. A stamper can be fabricated by patterning a resist into a desired boss pattern using an electron beam exposure apparatus, and then dry etching the patterned resist. The voltage applied in the anodic oxidation is desirably selected to a value corresponding to the length of a long side 21 (FIG. 2) of the rectangular array or the length of a long diagonal 31 (FIG. 3) of the rhombic array.

More specifically, an approximate relationship of 2R [nm] =2.5×V holds between the anodic oxidation voltage (V) and the length (2R [nm]) of the long side (long diagonal) of the formed nanohole. Therefore, when dents in a rectangular array are formed on the substrate at pitches of 100 nm×150 nm, for example, the anodic oxidation voltage is desirably set to 60 V. By carrying out the anodic oxidation at the desired anodic oxidation voltage corresponding to the length of the long side (long diagonal), it is possible to obtain higher uniformity in sectional shape of the nanohole and to increase the range of dent pitch within which the nanohole is not bifurcated. The pore (nanohole) shape approaches an ellipse as a ratio of long side (long diagonal) to short side (short diagonal) of a quadrilateral defined by four intersects increases. Also, by appropriately setting the anodic oxidation conditions, the pore can be selectively formed in a rectangular or square shape. When the ratio of long side (long diagonal) to short side (short diagonal) of a quadrilateral defined by four intersects is too increased, the nanoholes formed by the anodic oxidation are bifurcated in the direction of the long side (long diagonal) from their intermediate points.

Also, to form regular columnar nanoholes, the thickness of the Al film must be properly controlled with respect to the pore size. If the film thickness is too large with respect to the pore size, the nanoholes are bifurcated, thus resulting in an irregular structure.

Figure 4:
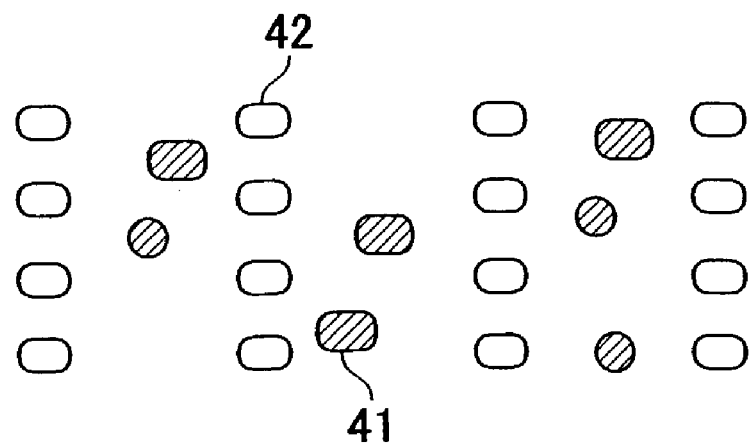
FIG. 4 is a schematic view showing nanoholes formed in irregular positions among a regular pore array.

Further, to form regular nanoholes each having the above-mentioned shape, it is preferable to set the ratio of the short side 22 to the long side 21 of the rectangular array to be held in the range of 1:1 to 1:2 (FIG. 2), or the ratio of the short diagonal 32 to the long diagonal 31 of the rhombic array to be held in the range of 1:1 to 1:2 (FIG. 3). When the ratio of the long side (long diagonal) to the short side (short diagonal) is too increased, nanoholes 41 are formed in irregular positions midway in the direction of the long side (long diagonal), as shown in FIG. 4, thus resulting in an irregular structure.

Figure 5:
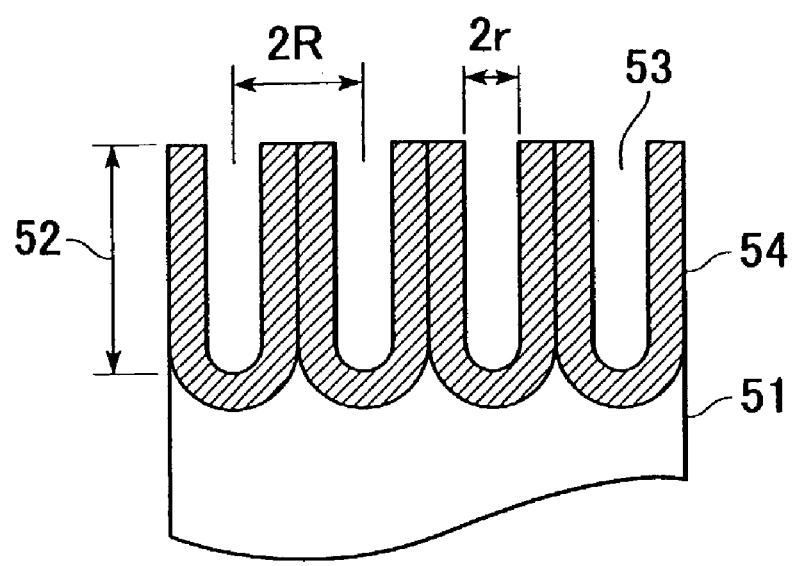
FIG. 5 is a sectional view of nanoholes sectioned in a direction crossing a recording surface.

FIG. 5 is a sectional view of the formed nanoholes sectioned in a direction crossing a recording surface. By changing the thickness of the film made of Al or containing Al as a main component, which is formed on the substrate, the depth of each of the formed nanoholes can be controlled. At this time, when the aspect ratio of the formed nanohole is set to be not larger than 1, this intensifies a tendency that the direction of magnetization of a magnetic substance filled in the nanohole is oriented in a direction along the recording surface of the magnetic substance because of anisotropy in shape. Further, the magnetization of magnetic substance is oriented in a certain direction in the substrate plane under the effect of anisotropy in shape resulting from the sectional shape of the nanohole. The larger the aspect ratio, the stronger is a tendency that the direction of magnetization of the magnetic substance filled in the nanohole is oriented in a direction crossing the recording surface of the magnetic substance because of anisotropy in shape. Though depending on the kind of the magnetic substance, the aspect ratio is preferably not smaller than 0.5 when the direction of magnetization is to be oriented in the direction crossing the recording surface of the magnetic substance.

The film made of Al or containing Al as a main component, which is subjected to the anodic oxidation, can be formed by the process such as vacuum vapor deposition with resistance heating, sputtering, or CVD. However, the process is required to be able to form a film having a relatively flat surface.

Although vacuum vapor deposition and sputtering are usable to fill the magnetic substance in the nanohole, electrodeposition is preferable from the viewpoint of filling the magnetic substance even in the pore having a high aspect ratio. An underlying electrode layer serving as an electrode for the electrodeposition is formed under the Al layer various kinds of substances are usable for the underlying electrode layer so long as the substance is an electrically conductive non-magnetic metal. However, Cu, an alloy containing Cu as a main component, or precious metals are preferable because of good electrodeposition controllability.

Furthermore, when the magnetic substance filled in the nanohole is magnetized in the direction crossing the recording surface, a soft magnetic layer made of Ni—Fe can be provided below the underlying electrode layer to serve as a soft under layer (SUL) for a recording layer formed by the magnetic substance filled in the nanohole.

A magnetic recording medium thus manufactured is provided as a medium (also called patterned media) in which application of a magnetic field and read of magnetization are performed for each nanohole and one nanohole serves as a minimum unit area for magnetic recording. Alternatively, the magnetic recording medium is provided as a medium (also called discrete media) in which application of a magnetic field and read of magnetization are performed for a plurality of nanoholes and the plurality of nanoholes serve as a minimum unit area for magnetic recording area.

The substrate surface including the nanoholes filled with the magnetic substances is preferably polished to be flat by using an abrasive such as a diamond slurry. Also, in order to provide wear resistance against a magnetic head for recording and reproducing bit information, a nonmagnetic material, such as carbon, carbide or nitride, can be coated as a protective layer on the substrate surface.

The substrate can be made of, e.g., plastic, Si, glass, carbon, Al plated with Ni—P, or Si—C.

EXAMPLES

Example 1

Formation of Nanoholes (1)

First, an Al film was formed in thickness of 500 nm on a Si substrate by sputtering. Then, dents serving as start points for nanohole formation were formed on an Al surface in a rectangular array. The dents serving as the start points for nanohole formation were formed by pressing a stamper against the Al surface so that a boss pattern on the stamper was transferred as a dent pattern to Al surface. The stamper was fabricated by coating an electron-beam resist in thickness of 100 nm on a quartz substrate by spin coating, patterning the resist into a desired boss pattern using an electron beam exposure apparatus, and then dry etching the patterned resist. The dry etching was carried out in plasma of 5 Pa and 150 W for two minutes by using $CF_4$ gas as an etching gas. In this Example 1, samples A to E were fabricated by changing the length of a long side of the rectangular array while the length of a short side was fixed to 100 nm.

The samples A to H were subjected to anodic oxidation in an aqueous solution of 0.3-M oxalic acid at 16° C. by applying an voltage of 40 V. Here, the applied voltage of 40 V means the anodic oxidation voltage corresponding to the nanohole pitch (length of the short side of the rectangular array) of 100 nm based on the above-mentioned formula of 2R [nm]=2.5×V. After the anodic oxidation, wet etching (pore widening process) was carried out by immersing the sample in an aqueous solution of 0.5-wt % phosphoric acid for 40 minutes. Then, the surface and section of each sample were observed using an FE-SEM (Field Emission Scanning Electron Microscope) to confirm the shapes of formed nanoholes. Observed results are shown in Table 1 given below.

TABLE 1

| Sample | A | B | C | D | E | F | G | H |
|---|---|---|---|---|---|---|---|---|
| Dent array | square | rectangular | rectangular | rectangular | rectangular | rectangular | rectangular | rectangular |
| Dent. pitch (nm) | 100 × 100 | 100 × 100 | 100 × 120 | 100 × 140 | 100 × 160 | 100 × 180 | 100 × 200 | 100 × 220 |
| Acid used | oxalic acid | oxalic acid | oxalic acid | oxalic acid | oxalic acid | oxalic acid | oxalic acid | oxalic acid |
| Anodic oxidation voltage | 40 V | 40 V | 40 V | 40 V | 40 V | 40 V | 40 V | 40 V |
| Pore widening process time | 40 min | 40 min | 40 min | 40 min | 40 min | 40 min | 40 min | 40 min |
| Nanohole shape | columnar | columnar | columnar | columnar | bifurcated | bifurcated | bifurcated | bifurcated |
| Regularity | ○ | ○ | ○ | ○ | ○ | ○ | ○ | x |

Figure 6:
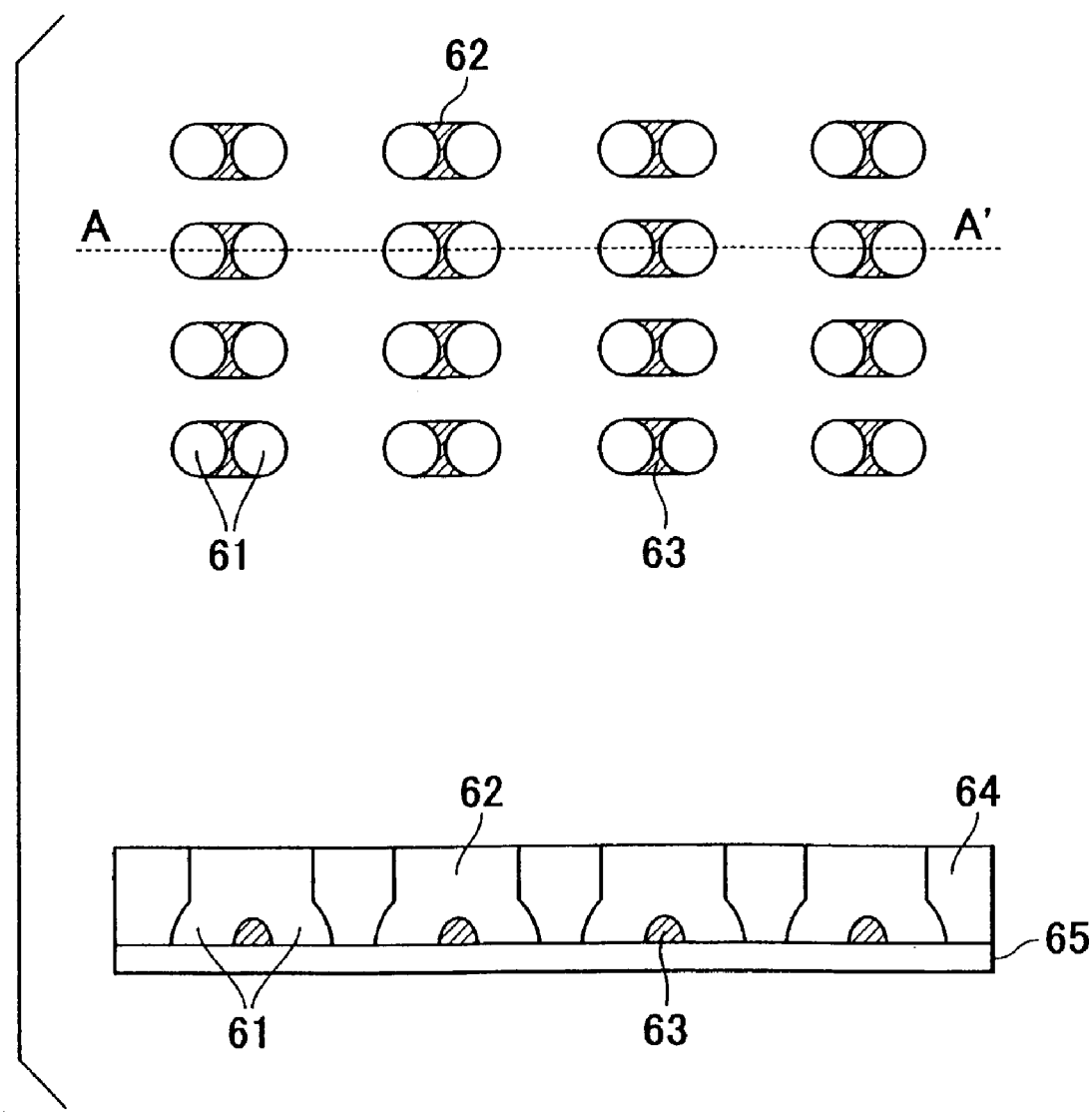
FIG. 6 is a set of schematic view showing bifurcated nanoholes and sectional view of the nanoholes sectioned in a direction crossing a recording surface.

Because the anodic oxidation voltage was 40 V corresponding to the pitch of 100 nm, nanoholes were regularly formed corresponding to the dent pitch in the sample A. The nanoholes had a circular shape in section. In the sample B to the sample D, nanoholes were regularly formed corresponding to the dent pitch and had an elliptic sectional shape elongated in the direction of the long pitch. In the sample E to the sample G, as shown in FIG. 6, the nanoholes were bifurcated in the direction of the long pitch during the progress of formation of the nanoholes, thus resulting in an irregular structure. An A–A' plane in FIG. 6 represents a plane dividing an elliptic magnetic substance into two in the direction of a major axis and sectioned in a direction crossing the recording surface.

Figure 7:
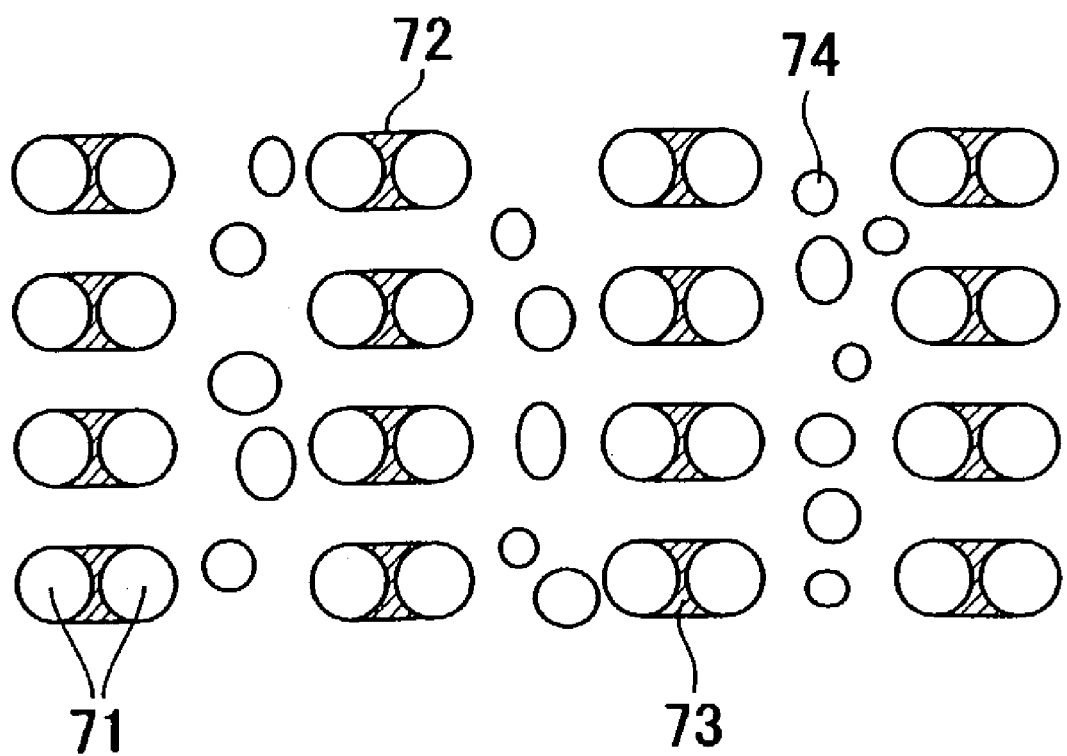
FIG. 7 is a schematic view showing nanoholes formed in irregular positions among a regular pore array.

In the substrate (alumina) surface, however, the nanoholes are formed to extend from the positions where the dents were formed, and regularity of the pore array was not disordered to a large extent. The sectional shapes of the nanoholes near the substrate surface before the start of bifurcation were elongated in the direction of the long pitch. In the sample H, the nanoholes were likewise bifurcated. Further, as shown in FIG. 7, nanoholes were also formed in irregular positions where the dents were not formed, thus resulting in an irregular structure.

From the results mentioned above, it was confirmed that when the ratio of the long side to the short side of the rectangular array of the dents serving as the start points for nanohole formation is increased, the formed nanoholes are bifurcated in the direction of the long side from intermediate points, thus resulting in an irregular structure. The formed columnar nanoholes have a sectional shape belong elongate in the direction of the long side and close to an elliptic. Comparing the sectional shapes of the nanoholes formed in the samples A to H, it was confirmed that the sectional shapes were gradually elongated in the direction of the long side with an increase of the long side.

Example 2

Formation of Nanoholes (2)

Unlike above Example 1, the anodic oxidation was carried out in this Example 2 at an anodic oxidation voltage corresponding to the length of the long side of the rectangular array of the dents serving as the start points for nanohole formation.

As in Example 1, an Al film was formed in thickness of 500 nm on a Si substrate by sputtering. Then, dents serving as start points for nanohole formation were formed on an Al surface in a rectangular array. In this Example 2, samples I to O were fabricated by changing the length of a long side of the rectangular array while the length of a short side was fixed to 100 nm.

The samples I to O were subjected to anodic oxidation in an aqueous solution of 0.3-M oxalic acid or 0.3-M phosphoric acid at 16° C. The anodic oxidation voltage was set to a value calculated from the above-mentioned formula of 2R [nm]=2.5×V for the length of the long side of each sample. After the anodic oxidation, the pore widening process was carried out by immersing the sample in an aqueous solution of 0.5-wt % phosphoric acid. The time of the pore widening process was set to a value in minutes equal to the value of the corresponding anodic oxidation voltage. Then, the surface and section of each sample were observed using an FE-SEM to confirm the shapes of formed nanoholes. Observed results are shown in Table 2 given below.

than those in the samples B and D of above Example 1. Though in the samples M and N, the shapes of the nanoholes were bifurcated midway, all the nanoholes were formed from the positions where the dents were formed, and regularity was not disordered. In the sample O, the shapes of the nanoholes were bifurcated midway. Further, nanoholes were also generated in irregular positions where the dents were not formed, thus resulting in an irregular structure.

As seen from the results of this Example 2 and the results of above Example 1, higher uniformity in sectional shapes of the nanoholes was obtained in the case of carrying out the anodic oxidation at the anodic oxidation voltage corresponding to the length of the long side of the rectangular array of the dents serving as the start points for nanohole formation. It was hence confirmed that the dent pitch range, within which the nanoholes were not bifurcated, could be enlarged by carrying out the anodic oxidation at the anodic oxidation voltage corresponding to the length of the long side of the rectangular array, with the view of obtaining pores having more uniform sectional shapes.

Example 3

Formation of Nanoholes (3)

In this Example 3, similar experiments to those in above Example 1 were performed while the pitches of the dents serving as the start points for nanohole formation were set to larger values than those in Examples 1 and 2.

As in Example 1, an Al film was formed in thickness of 500 nm on a Si substrate by sputtering. Then, dents serving as start points for nanohole formation were formed on an Al surface in a rectangular array. In this Example 3, samples P to S were fabricated by changing the length of a long side of the rectangular array while the length of a short side was fixed to 200 nm.

TABLE 2

| Sample | I | J | K | L | M | N | O |
| --- | --- | --- | --- | --- | --- | --- | --- |
| Dent array | rectangular | rectangular | rectangular | rectangular | rectangular | rectangular | rectangular |
| Dent pitch (nm) | 100 × 100 | 100 × 120 | 100 × 140 | 100 × 160 | 100 × 180 | 100 × 200 | 100 × 220 |
| Acid used | oxalic acid | oxalic acid | oxalic acid | oxalic acid | phosphoric acid | phosphoric acid | phosphoric acid |
| Anodic oxidation voltage | 40 V | 48 V | 56 V | 64 V | 72 V | 80 V | 88 V |
| Pore widening process time | 40 min | 48 min | 56 min | 64 min | 72 min | 80 min | 88 min |
| Nanohole shape | columnar | columnar | columnar | columnar | bifurcated | bifurcated | bifurcated |
| Regularity | ○ | ○ | ○ | ○ | ○ | ○ | x |

In the samples I to J of this Example 2, i.e., over the pitch range until 100 nm×160 nm, columnar nanoholes were formed without bifurcating. As in above Example 1, the sectional shapes of the formed nanoholes were elongated in the direction of the long side of the rectangular array. Also, there was found a tendency that as the length of the long side of the rectangular array increased, the sectional shapes of the formed nanoholes were gradually elongated in the direction of the long side. Comparing the samples B and I, the samples C and J, and the samples D and K having the same dent pitches, however, the individual nanoholes in the samples I, J and K of this Example 2 have more uniform sectional shapes and hence have higher uniformity in sectional shapes The samples P to S were subjected to anodic oxidation in an aqueous solution of 0.3-M phosphoric acid at 10° C. by applying an voltage of 80 V. Here, the applied voltage of 80 V means the anodic oxidation voltage corresponding to 200 nm (length of the short side of the rectangular array) based on the above-mentioned formula of 2R [nm]=2.5×V. After the anodic oxidation, the pore widening process was carried out by immersing the sample in an aqueous solution of 0.5-wt % phosphoric acid for 85 minutes. Then, the surface and section of each sample were observed using an FE-SEM to confirm the shapes of formed nanoholes. Observed results are shown in Table 3 given below.

TABLE 3

| Sample | P | Q | R | S |
|---|---|---|---|---|
| Dent array | square | rectangular | rectangular | rectangular |
| Dent pitch (nm) | 200 × 200 | 200 × 220 | 200 × 240 | 200 × 250 |
| Anodic oxidation voltage | 80 V | 80 V | 80 V | 80 V |
| Pore widening process time | 85 min | 85 min | 85 min | 85 min |
| Nanohole shape | columnar | columnar | columnar | columnar |
| Regularity | ○ | ○ | Δ | x |

In the sample P, as in the sample A, nanoholes were uniformly formed corresponding to the dent pitch.

However, the sectional shapes of the nanoholes were not circular unlike the result observed in the sample A, but nearly square. In the sample Q, columnar nanoholes were formed corresponding to the dent pitches and had nearly rectangular sectional shapes, which are elongated in the direction of the 220-nm pitch and slightly rounded as a whole. However, the sectional shapes of the individual nanoholes were poor in uniformity. In the sample R, nanoholes were generated in some irregular positions in addition to columnar nanoholes formed corresponding to the dent pitches. In the sample S, many nanoholes were formed in irregular positions. Thus, an irregular structure was resulted in the samples R and S.

Similar experiments to those described above were performed while the anodic oxidation voltage was set to 100 V. Obtained results are shown in Table 4 given below.

TABLE 4

| Sample | T | U | V |
|---|---|---|---|
| Dent array | rectangular | rectangular | rectangular |
| Dent pitch (nm) | 200 × 220 | 200 × 240 | 200 × 250 |
| Anodic oxidation voltage | 100 V | 100 V | 100 V |
| Pore widening process time | 85 min | 85 min | 85 min |
| Nanohole shape | columnar | columnar | columnar |
| Regularity | ○ | ○ | Δ |

Comparing the samples Q and T and the samples R and U with each other, it was confirmed that the sectional shapes of the nanoholes formed in the samples T and U have higher uniformity than those formed in the samples Q and R. The sectional shapes of the nanoholes in the samples T and U were slightly less round and closer to a rectangle than those in the samples Q and R. Further, comparing the samples T and U with each other, the sectional shapes of the nanoholes formed in the sample T have higher uniformity than those formed in the sample U. In the sample V, nanoholes were generated in some irregular positions in addition to columnar nanoholes formed corresponding to the dent pitches, thus resulting in an irregular structure. In all of the samples T to V, the nanoholes had a columnar shape and were not bifurcated.

In this Example 3, the formed nanoholes were not bifurcated unlike Examples 1 and 2. The reason is presumably in that, while the formed nanoholes had larger sectional sizes than those in Examples 1 and 2 because of the larger dent pitches and the higher anodic oxidation voltage, the anodic oxidation was brought to an end before the start of bifurcation of the nanoholes because the thickness of the Al film formed on the silicon substrate was held at 500 nm and hence the nanoholes had the same depth as that in Examples 1 and 2. As a result of conducting similar experiments with the thickness of the Al film set to 1 μm, bifurcation of formed nanoholes was confirmed. It was thus confirmed that, to form regular columnar nanoholes, controlling the thickness of the Al film is also important in addition to the pitches of the dents serving as the start points for nanohole formation.

Example 4

Formation of Nanoholes (4)

In this Example 4, similar experiments to those in above Example 2 were performed while the thickness of the Al film was set to 50 nm. Obtained results are shown in Table 5 given below.

TABLE 5

| Sample | W | X | Y | Z | α | β | γ |
|---|---|---|---|---|---|---|---|
| Dent array | rectangular | rectangular | rectangular | rectangular | rectangular | rectangular | rectangular |
| Dent pitch (nm) | 100 × 110 | 100 × 120 | 100 × 140 | 100 × 160 | 100 × 180 | 100 × 200 | 100 × 220 |
| Acid used | oxalic acid | oxalic acid | oxalic acid | oxalic acid | phosphoric acid | phosphoric acid | phosphoric acid |
| Anodic oxidation voltage | 40 V | 48 V | 56 V | 64 V | 72 V | 80 V | 88 V |
| Pore widening process time | 40 min | 48 min | 56 min | 64 min | 72 min | 80 min | 88 min |
| Nanohole shape | Columnar | columnar | columnar | columnar | columnar | columnar | bifurcated |
| Regularity | ○ | ○ | ○ | ○ | ○ | ○ | x |

In the samples W to Z and α to β of this Example 4, i.e., over the pitch range until 100 nm×200 nm, columnar nanoholes were formed without bifurcating. The reason why the dent pitch range within which columnar nanoholes were formed without bifurcating was wider in Example 3 than Example 2 is presumably in that the anodic oxidation was brought to an end before the start of bifurcation of the nanoholes because the thickness of the Al film was reduced. As in above Example 2, the sectional shapes of the nanoholes formed in the samples W to Z and α to β were elongated in the direction of the long side of the rectangular array. Also, there was found a tendency that as the length of the long side of the rectangular array increased, the sectional shapes of the nanoholes were gradually elongated in the direction of the long side. Further, the sectional shapes of the nanoholes had higher uniformity. In the sample γ, it was confirmed that the nanoholes were not only bifurcated, but also generated in irregular positions where the dents were not formed, thus resulting in an irregular structure.

In this Example 4, the dent pitch range within which columnar nanoholes were formed without bifurcating could be enlarged by reducing the thickness of the Al film. Stated otherwise, it was confirmed that, for the Al film having the thickness of 50 nm, columnar nanoholes having higher uniformity in sectional shapes and elongated in the direction of the long side of the rectangular array were formed over the dent pitch range up to 100 nm×200 nm.

Example 5

Electrodeposition of Magnetic Substances into Nanoholes (1)

In this Example 5, magnetic substances were filled in nanoholes by electrodeposition such that magnetization of the magnetic substances filled in the nanoholes was oriented in a direction along a recording surface.

First, a Cu film serving as an underlying electrode layer was formed in thickness of 20 nm on a Si substrate by sputtering, and an Al film was formed in thickness of 50 nm thereon. Then, dents serving as start points for nanohole formation were formed on an Al surface in a rectangular array of 100 nm×200 nm. The substrate was subjected to anodic oxidation in an aqueous solution of 0.3-M phosphoric acid at 16° C. by applying a voltage of 80 V. After the anodic oxidation, the pore widening process was carried out by immersing the substrate in an aqueous solution of 0.5-wt % phosphoric acid for 80 minutes. Formed nanoholes had an aspect ratio of 0.5.

Into the nanoholes formed through the above-described steps, Ni was filled by electrodeposition. The electrodeposition was carried out using a mixed solution of 0.2-M nickel sulfate (II)·7 hydrates and 0.3-M boric acid at 24° C. Ni was electrodeposited at −1.0 v with Ag/AgCl used as a reference electrode. The electrodeposit (Ni) spilling out of the nanoholes was removed by polishing the substrate surface such that the substrate surface and the pores filled with the magnetic substances form a flat surface. In the polishing step, a diamond slurry of ¼ μm was used as an abrasive.

As a result of observing a part of the substrate surface using an FE-SEM, it was confirmed from a plan image of the substrate surface that Ni was filled in all the nanoholes.

Figure 8A:
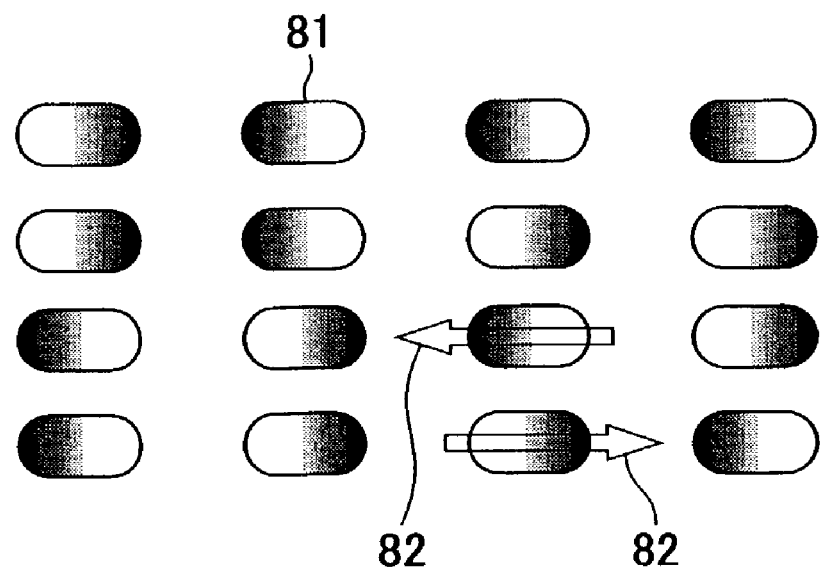
FIGS. 8A and 8B are schematic views showing magnetic substances magnetized in a direction along the recording surface.

Next, for examining magnetizing directions of Ni filled in the nanoholes, the substrate surface was observed using an MFM (Magnetic Force Microscope). In a resulting image, as shown in FIG. 8A, the magnetization of Ni filled in each of the nanoholes was oriented in the direction along the recording surface. The magnetizing directions in a plane were also evenly oriented in one direction as a result of anisotropy in shape reflecting the sectional shapes of the nanoholes elongated in one direction. The fact that the magnetizing directions in a plane are evenly oriented in one direction is advantageous when recording and reproducing bit information with a magnetic head, because the hypothetic positional relationship between the direction of magnetization and the head can be always held constant.

Figure 8B:
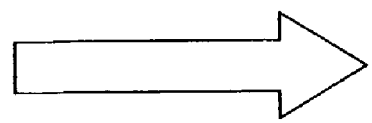
Figure 8B:
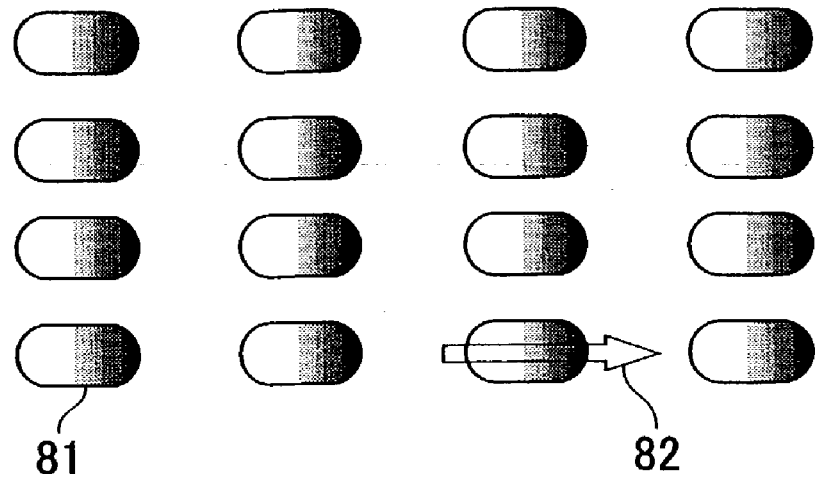

Then, by applying a magnetic field of 3 kOe in the direction along the recording surface of this sample, as shown in FIG. 8B, the magnetizing directions of Ni filled in the nanoholes were made evenly oriented in the direction of the applied magnetic field. As a result of observing the sample surface using an MFM, it was confirmed that the magnetizing directions of all the nanoholes were evenly oriented in the direction of the applied magnetic field. Thereafter, a magnetic field of 3 kOe was applied to the sample in the reversed direction, and the sample surface was observed using an MFM. As a result, it was confirmed that the magnetizing directions of all the nanoholes were reversed and evenly oriented in the direction of the applied magnetic field.

By applying the magnetic field and reading the magnetization with the magnetic head, the sample can be used as a magnetic recording medium in which the direction of magnetization usable for recording and reproduction is provided as the direction along the recording surface. One example of the magnetic recording medium is one in which application of a magnetic field and read of magnetization are performed for each nanohole and one nanohole serves as a minimum unit area for magnetic recording. Another example of the magnetic recording medium is one in which application of a magnetic field and read of magnetization are performed for a plurality of nanoholes and the plurality of nanoholes serve as a minimum unit area for magnetic recording.

Example 6

Electrodeposition of Magnetic Substances into Nanoholes (2)

In this Example 6, magnetic substances were filled in nanoholes by electrodeposition such that magnetization of the magnetic substances filled in the nanoholes was oriented in a direction crossing a recording surface.

First, a Cu film serving as an underlying electrode layer was formed in thickness of 20 nm on a Si substrate by sputtering, and an Al film was formed in thickness of 500 nm thereon. Then, dents serving as start points for nanohole formation were formed on an Al surface in a rectangular array of 200 nm×240 nm. The substrate was subjected to anodic oxidation in an aqueous solution of 0.3-M phosphoric acid at 10° C. by applying a voltage of 100 V. After the anodic oxidation, the pore widening process was carried out by immersing the substrate in an aqueous solution of 0.5-wt % phosphoric acid for 85 minutes. Formed nanoholes had an aspect ratio of 2.5.

Into the nanoholes formed through the above-described steps, Co of the hcp structure having a c-axis oriented in the direction crossing the recording surface was filled by electrodeposition. In this Example 6, since the nanoholes had a higher aspect ratio than those in Example 5 (aspect ratio=0.5), the c-axis of Co could be oriented in the direction crossing the recording surface. The electrodeposition was carried out using a mixed solution of 0.2-M cobalt sulfate (II)·7 hydrates and 0.3-M boric acid at 24° C. Co was electrodeposited at −1.0 V with Ag/AgCl used as a reference electrode. The electrodeposit (Co) spilling out of the nanoholes was removed by polishing the substrate surface such that the substrate surface and the pores filled with the magnetic substances form a flat surface. In the polishing step, a diamond slurry of ¼ μm was used as an abrasive.

As a result of observing a part of the substrate surface using an FE-SEM, it was confirmed from a plan image of the substrate surface that Co was filled in all the nanoholes.

Figure 9A:
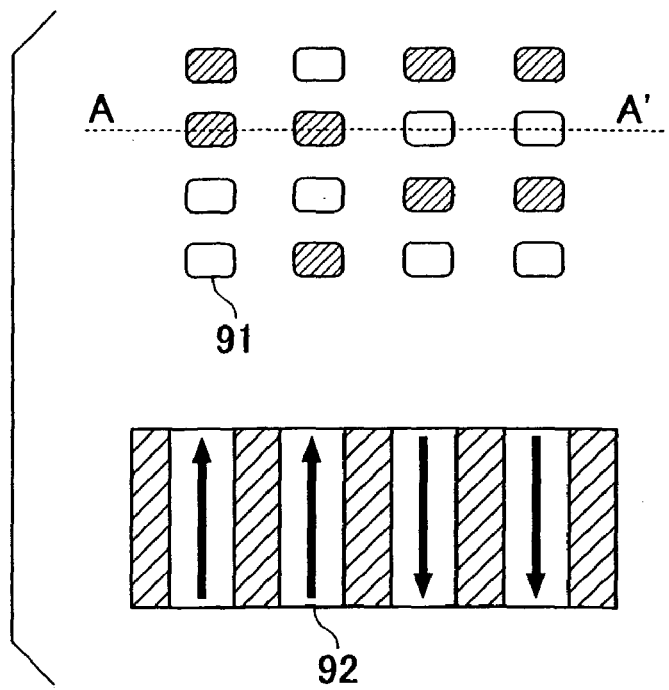
FIGS. 9A and 9B are each a set of schematic view showing magnetic substances magnetized in a direction crossing the recording surface and sectional view of elliptic magnetic substances sectioned in a plane dividing each magnetic substance into two in the direction of a major axis and in a direction crossing the recording surface.
Figure 9B:
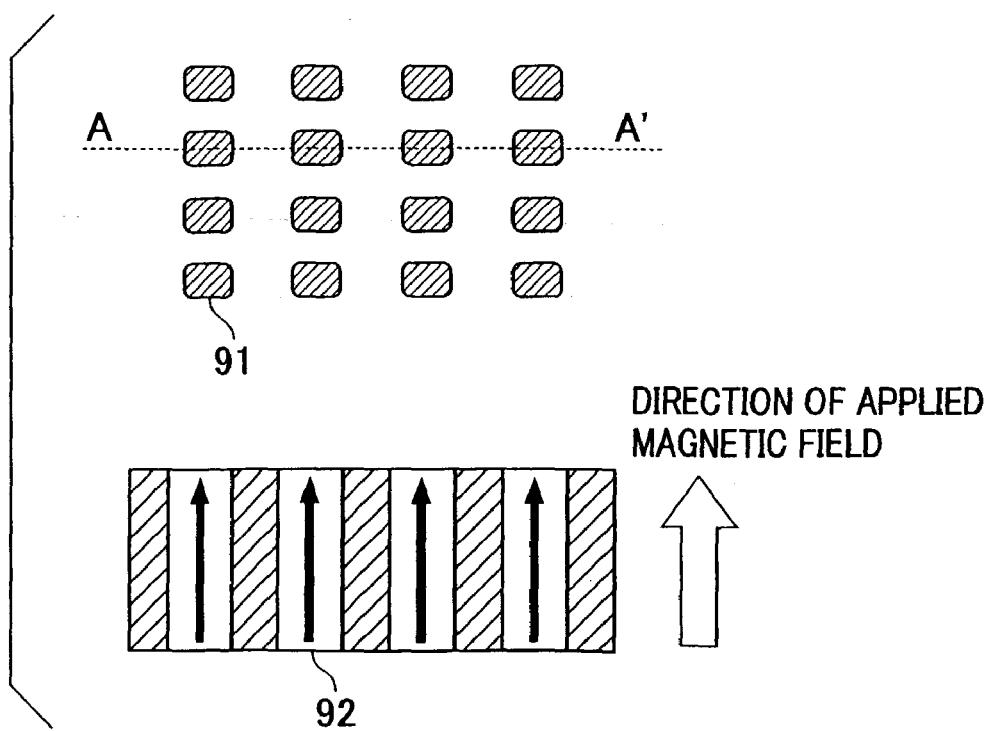

Next, for examining magnetizing directions of Co filled in the nanoholes, the surface of this sample was observed using an MFM. Observed results are shown in FIGS. 9A and 9B. An A–A' plane in FIGS. 9A and 9B represents a plane dividing an elliptic magnetic substance into two in the direction of a major axis and sectioned in the direction crossing the recording surface. Unlike the image obtained in Example 4, it was confirmed from the result of FIG. 9A that a difference in contrast did not appear in each of the nanoholes in the in-plane directions and the magnetization of Co filled in each nanohole was oriented in the direction crossing the recording surface.

Then, a magnetic field of 3 kOe was applied in the direction crossing the recording surface, and the sample surface was observed using an MFM. As a result, as shown in FIG. 9B, the magnetizing directions of Co filled in all the nanoholes were made evenly oriented in the direction of the applied magnetic field. Thereafter, a magnetic field of 3 kOe was applied in the reversed direction, and the substrate surface was observed using an MFM. As a result, the magnetizing directions of Co filled all the nanoholes were reversed and evenly oriented in the direction of the applied magnetic field.

By applying the magnetic field and reading the magnetization with the magnetic head, the sample can be used as a magnetic recording medium in which the direction of magnetization usable for recording and reproduction is provided as the direction crossing the recording surface. One example of the magnetic recording medium is one in which application of a magnetic field and read of magnetization are performed for each nanohole and one nanohole serves as a minimum unit area for magnetic recording. Another example of the magnetic recording medium is one in which application of a magnetic field and read of magnetization are performed for a plurality of nanoholes and the plurality of nanoholes serve as a minimum unit area for magnetic recording.

The magnetic recording medium according to the present invention, in which the magnetic substances are magnetized in the direction along the recording surface or the direction crossing the recording surface by utilizing the nanoholes having specific sectional shapes is more advantageous than a conventional medium in that, assuming the nanoholes to have the same recording density and the same height, the nanoholes in the present invention have a larger volume than conventional circular nanoholes and hence a higher signal can be obtained from the medium.

Example 7

Pore Widening Process

In this Example 7, the sectional shapes of formed nanoholes were changed by wet etching.

An Al film was formed in thickness of 500 nm on a Si substrate by sputtering. Then, dents serving as start points for nanohole formation were formed on an Al surface in a rectangular array of 200 nm×240 nm pitches.

This sample was subjected to anodic oxidation in an aqueous solution of 0.3-M phosphoric acid at 10° C. by applying a voltage of 100 V. After the anodic oxidation, the pore widening process was carried out by immersing the sample in an aqueous solution of 0.5-wt % phosphoric acid for 60 minutes and 120 minutes. Subsequently, the sample surface was using an FE-SEM to confirm sectional shapes of formed nanoholes.

While the sectional shapes of the nanoholes were nearly rectangular, the nanoholes in the sample subjected to the pore widening process for 120 minutes had a shape closer to a square than those in the sample subjected to the pore widening process for 60 minutes.

From the above results, it was confirmed that the sectional shapes of the nanoholes can be varied by changing the time of the pore widening process. As a whole, there was a tendency that as the time of the pore widening process increased, the sectional shapes of the nanoholes approach a shape not elongated in one direction, such as a square or circular shape.

According to the present invention, as described above, a magnetic recording medium having a high density and good storage stability can be provided by giving anisotropy in shape to a magnetic substance.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A magnetic recording device comprising:
 a substrate and a magnetic recording layer on the substrate, said
 a substrate having pores extending in a direction crossing the substrate, and a magnetic filling material in the pores;
 wherein each of the pores has an orderly bifurcated structure of a non-bifurcated portion and a bifurcated portion, wherein a cross-sectional shape of each of the non-bifurcated portions is an ellipse and the bifurcated portion diverges along a direction of a major axis of the ellipse.

2. A device according to claim 1, wherein a first interval between the pores in a direction of a minor axis of the ellipse is different from a second interval between the pores in a direction of a major axis of the ellipse.

3. A device according to claim 1, wherein the substrate is porous alumina.

4. A device according to claim 1, wherein the substrate comprises aluminum as a main component.

5. A device according to claim 1 wherein the cross-sectional shape is spaced parallel to an in-plane direction of the substrate.

* * * * *

UNITED STATES PATENT AND TRADEMARK OFFICE
CERTIFICATE OF CORRECTION

PATENT NO.        : 7,183,012 B2                                      Page 1 of 1
APPLICATION NO. : 10/389935
DATED             : February 27, 2007
INVENTOR(S)       : Tatsuya Saito et al.

It is certified that error appears in the above-identified patent and that said Letters Patent is hereby corrected as shown below:

COLUMN 7

Line 6, "layer" should read --layer.--; and
    Line 7, "various" should read --Various--.

COLUMN 8

Line T1, "B_____" should read --B_____--.
        rectangular            rectangular
        100 x 100              100 x 110

COLUMN 9

Line T2, "I_____" should read --I_____--.
        rectangular            rectangular
        100 x 100              100 x 110

COLUMN 16

Line 34, "a substrate" should read --said substrate--; and
    Line 51, "claim 1" should read --claim 1,--.

Signed and Sealed this

Twenty-sixth Day of February, 2008

JON W. DUDAS
*Director of the United States Patent and Trademark Office*